US007132742B2

(12) United States Patent
Yamaguchi

(10) Patent No.: US 7,132,742 B2
(45) Date of Patent: Nov. 7, 2006

(54) SEMICONDUCTOR DEVICE, METHOD OF MANUFACTURING THE SAME, CIRCUIT BOARD, AND ELECTRONIC INSTRUMENT

(75) Inventor: Koji Yamaguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 80 days.

(21) Appl. No.: 10/637,614

(22) Filed: Aug. 11, 2003

(65) Prior Publication Data

US 2004/0166660 A1 Aug. 26, 2004

(30) Foreign Application Priority Data

Aug. 21, 2002 (JP) ............................ 2002-240778
Aug. 1, 2003 (JP) ............................ 2003-284994

(51) Int. Cl.
*H01L 23/12* (2006.01)
*H01L 23/053* (2006.01)

(52) U.S. Cl. ...................... 257/700; 257/737; 257/778; 257/E23.068; 257/E23.069

(58) Field of Classification Search ................ 257/737, 257/779, 723, 778, 747, 669, 678, 700, 783, 257/E23.068, E23.069; 438/106, 121
See application file for complete search history.

(56) References Cited

U.S. PATENT DOCUMENTS 5,814,891 A * 9/1998 Hirano ....................... 257/778
5,889,327 A * 3/1999 Washida et al. ............ 257/737
6,531,785 B1 * 3/2003 Shimizu et al. ............. 257/786
6,677,677 B1 * 1/2004 Kimura et al. .............. 257/737
6,696,765 B1 * 2/2004 Kazama et al. ............. 257/779
6,713,850 B1 * 3/2004 Yuan et al. ................. 257/668
2003/0168739 A1 * 9/2003 Huang ........................ 257/738

OTHER PUBLICATIONS

U.S. Appl. No. 10/637,615, filed Aug. 11, 2003, Yamaguchi.

* cited by examiner

*Primary Examiner*—Evan Pert
*Assistant Examiner*—Victor A. Mandala, Jr.
(74) *Attorney, Agent, or Firm*—Oliff & Berridge, PLC

(57) ABSTRACT

A semiconductor device includes a semiconductor substrate in which an integrated circuit is formed and which includes interconnects and electrodes, the interconnects electrically connected with the semiconductor substrate, and the electrodes being formed on the interconnects; a resin layer formed on the semiconductor substrate; redistribution interconnects electrically connected with the electrodes; a plurality of external terminals which are formed on the redistribution interconnects and supported by the resin layer; and a plurality of dummy terminals supported by the resin layer without being electrically connected with the electrodes.

17 Claims, 7 Drawing Sheets

26 24 24 30 22 16 14 18 20 12 10

SEMICONDUCTOR DEVICE, METHOD OF MANUFACTURING THE SAME, CIRCUIT BOARD, AND ELECTRONIC INSTRUMENT

Japanese Patent Application No. 2002-240778 filed on Aug. 21, 2002, and Japanese Patent Application No. 2003-284994 filed on Aug. 1, 2003, are hereby incorporated by reference in their entirety.

BACKGROUND OF THE INVENTION

The present invention relates to a semiconductor device, a method of manufacturing the same, a circuit board, and an electronic instrument.

FIG. 16 is a plan view showing a schematic configuration of a conventional ball grid array package. FIG. 17 is a cross-sectional view of the ball grid array package shown in FIG. 16 along the line XVII—XVII.

In a conventional ball grid array, solder balls which become external terminals are disposed in a full grid arrangement or a staggered arrangement. Interconnects 502 and 504 are formed on each side of an interposer 500. The interconnects 502 and 504 are connected through through-holes 506 formed in the interposer 500. An IC chip 508 is mounted on the surface of the interposer 500. The IC chip 508 is connected with the interconnects 502 through bumps 510 and is sealed with a mold resin 512. Solder balls 514 are disposed on the back surface of the interposer 500 in a full grid arrangement. The solder ball 514 is connected with the interconnect 504.

In a conventional ball grid array, if the interposer 500 is mounted on a motherboard, force is applied to the solder balls 514 due to shrinkage of the interposer 500. In particular, a large amount of force is applied to the solder ball 514 near the edge of the interposer 500. In the case where the size of the interposer 500 is large, it is difficult to prevent connection failure of the solder ball 514.

BRIEF SUMMARY OF THE INVENTION

A semiconductor device according to one aspect of the present invention includes:

a semiconductor substrate in which an integrated circuit is formed and which includes interconnects and electrodes, the interconnects electrically connected with the semiconductor substrate, and the electrodes being formed on the interconnects;

a resin layer formed on the semiconductor substrate;

wiring pattern electrically connected with the electrodes;

a plurality of external terminals which are formed on the wiring pattern and supported by the resin layer; and a plurality of dummy terminals supported by the resin layer without being electrically connected with the electrodes.

A semiconductor device according to another aspect of the present invention includes:

an interposer substrate on which a semiconductor chip is surface-mounted;

an interconnect layer formed on a back surface of the interposer substrate;

a dummy bump which is formed on the back surface of the interposer substrate and disposed in an outermost region of the interposer substrate;

an external terminal which is disposed closer to a center of the interposer substrate than the dummy bump and connected with the interconnect layer; and a through-hole which is formed in the interposer substrate and connects the semiconductor chip with the interconnect layer.

A circuit board according to a further aspect of the present invention has the above semiconductor device mounted thereon.

An electronic instrument according to a still further aspect of the present invention includes the above semiconductor device.

A method of manufacturing a semiconductor device according to a yet further aspect of the present invention includes:

forming a resin layer on a semiconductor substrate in which an integrated circuit is formed and which includes interconnects and electrodes, the interconnects electrically connected with the semiconductor substrate, and the electrodes being formed on the interconnects;

forming wiring pattern so as to be electrically connected with the electrodes;

forming a plurality of external terminals on the wiring pattern so as to be supported by the resin layer; and forming a plurality of dummy terminals so as to be supported by the resin layer without being electrically connected with the electrodes.

DETAILED DESCRIPTION OF THE EMBODIMENT

Figure 1:
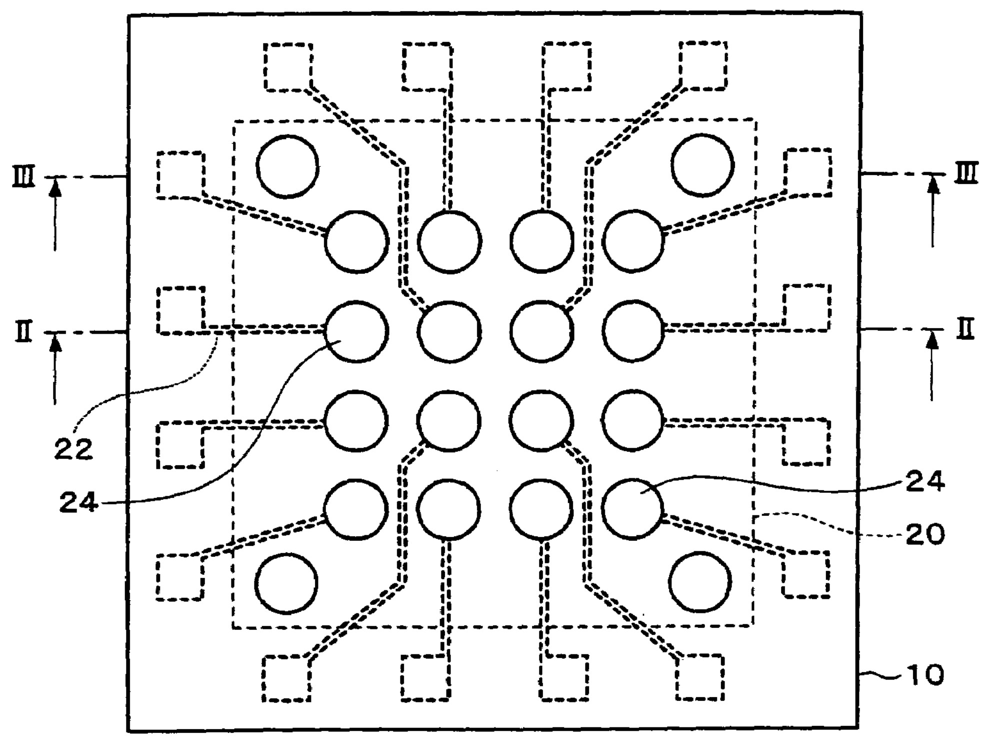
FIG. 1 is illustrative of a semiconductor device according to a first embodiment of the present invention.

Embodiments of the present invention may reduce connection failure of external terminals.

(1) A semiconductor device according to one embodiment of the present invention includes:

a semiconductor substrate in which an integrated circuit is formed and which includes interconnects and electrodes, the interconnects electrically connected with the semiconductor substrate, and the electrodes being formed on the interconnects;

a resin layer formed on the semiconductor substrate;

wiring pattern electrically connected with the electrodes;

a plurality of external terminals which are formed on the wiring pattern and supported by the resin layer; and a plurality of dummy terminals supported by the resin layer without being electrically connected with the electrodes. According to this semiconductor device, since bonding strength can be increased by the dummy terminals when bonding the semiconductor device to a motherboard or the like, electrical connection failure of the external terminals can be reduced.

(2) In this semiconductor device, an upper surface of the resin layer may include a first region which is located in an end portion of the resin layer and a second region which is closer to a center of the resin layer than the first region, the dummy terminals may be formed in the first region, and the external terminals may be formed in the second region.

(3) In this semiconductor device, the upper surface of the resin layer may be in a shape of a rectangle, and the dummy terminals may be formed at least at a pair of corners of the rectangle on a diagonal.

(4) In this semiconductor device, the upper surface of the resin layer may have an oblong shape, and the dummy terminals may be formed on both ends of the oblong shape in a longitudinal direction.

(5) In this semiconductor device, at least two of the dummy terminals may be disposed adjacent to each other.

(6) In this semiconductor device, each of the dummy terminals may be formed of a material different from a material for each of the external terminals.

(7) In this semiconductor device, each of the dummy terminals may be formed to include a center portion formed of a resin and a surface layer formed of solder.

(8) In this semiconductor device, each of the dummy terminals may be larger than each of the external terminals.

(9) This semiconductor device may further include a conductive film which is formed below the external terminals and the dummy terminals.

(10) In this semiconductor device, the conductive film may be formed over the semiconductor substrate and under the resin layer.

(11) In this semiconductor device, the conductive film may be formed to cover a region in which the integrated circuit is formed.

(12) In this semiconductor device, the conductive film may be divided into a plurality of sections provided at an interval from each other.

(13) In this semiconductor device, the integrated circuit may be formed in a region in which the plurality of sections forming the conductive film are formed.

(14) In this semiconductor device, the conductive film may be electrically connected with the dummy terminals without being electrically connected with the electrodes.

(15) A semiconductor device according to another embodiment of the present invention includes:

an interposer substrate on which a semiconductor chip is surface-mounted;

an interconnect layer formed on a back surface of the interposer substrate;

a dummy bump which is formed on the back surface of the interposer substrate and disposed in an outermost region of the interposer substrate;

an external terminal which is disposed closer to a center of the interposer substrate than the dummy bump and connected with the interconnect layer; and a through-hole which is formed in the interposer substrate and connects the semiconductor chip with the interconnect layer. According to this semiconductor device, since it is unnecessary to dispose solder balls in the region in which the frequency of connection failure is high, the connection state of the solder balls can be reinforced by the dummy bumps when mounting the semiconductor device on a motherboard. Therefore, connection failure of the solder balls can be reduced without increasing the number of steps even if the size of the interposer substrate is increased, whereby reliability during secondary mounting can be improved while preventing a decrease in throughput.

(16) A circuit board according to a further embodiment of the present invention has the above semiconductor device mounted thereon.

(17) An electronic instrument according to a still further embodiment of the present invention includes the above semiconductor device.

(18) A method of manufacturing a semiconductor device according to a yet further embodiment of the present invention includes:

forming a resin layer on a semiconductor substrate in which an integrated circuit is formed and which includes interconnects and electrodes, the interconnects electrically connected with the semiconductor substrate, and the electrodes being formed on the interconnects;

forming wiring pattern so as to be electrically connected with the electrodes;

forming a plurality of external terminals on the wiring pattern so as to be supported by the resin layer; and forming a plurality of dummy terminals so as to be supported by the resin layer without being electrically connected with the electrodes. According to this method of manufacturing a semiconductor device, since bonding strength can be increased by the dummy terminals when bonding the semiconductor device to a motherboard or the like, electrical connection failure of the external terminals can be reduced.

The embodiments of the present invention are described below with reference to the drawings.

First Embodiment

Figure 2:
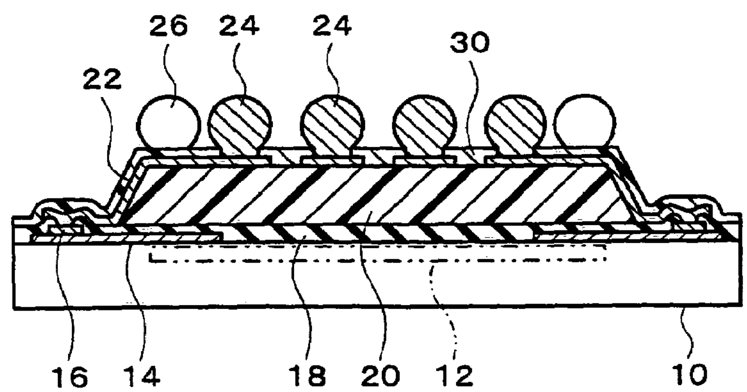
FIG. 2 is a cross-sectional view of the semiconductor device shown in FIG. 1 along the line II—II.
Figure 3:
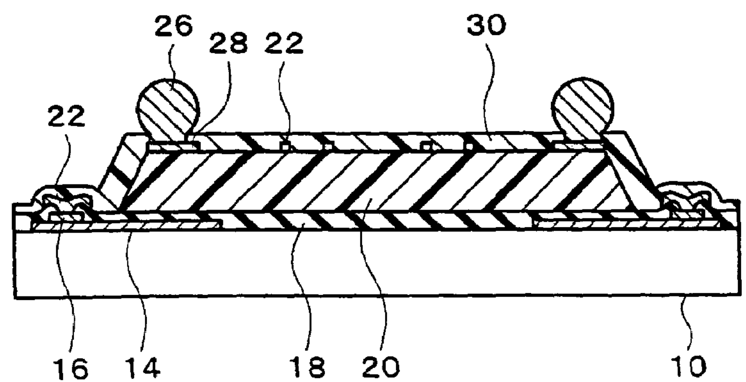
FIG. 3 is a cross-sectional view of the semiconductor device shown in FIG. 1 along the line III—III.

FIG. 1 is illustrative of a semiconductor device according to a first embodiment of the present invention. FIG. 2 is a cross-sectional view of the semiconductor device shown in FIG. 1 along the line II—II. FIG. 3 is a cross-sectional view of the semiconductor device shown in FIG. 1 along the line III—III. The semiconductor device includes a semiconductor substrate 10. The semiconductor substrate 10 shown in FIG. 1 is a semiconductor chip. However, a semiconductor wafer may also be used. An integrated circuit 12 is formed in the semiconductor substrate 10. One integrated circuit 12 is formed in a semiconductor chip, and a plurality of integrated circuits 12 are formed in a semiconductor wafer. A region in which the integrated circuit 12 is formed may be referred to as an active region.

The semiconductor substrate 10 includes a plurality of interconnects (or interconnect layer) 14 electrically connected with the semiconductor substrate 10. The interconnects 14 include an interconnect electrically connected with the integrated circuit 12 (or active region). The interconnects 14 may include an interconnect which is connected with the semiconductor substrate 10 without being electrically connected with the integrated circuit 12. An electrode (pad) 16 is formed on the interconnect 14.

The semiconductor substrate 10 may include a passivation film 18. The passivation film 18 may be a resin film, a silicon oxide film, or a silicon nitride film. The passivation film 18 may be transparent such as a silicon oxide film, or may be opaque. The passivation film 18 may be formed to avoid a part (center, for example) of the electrodes 16. The passivation film 18 covers the interconnects 14. The passivation film 18 may cover the entire integrated circuit 12 (or active region).

A resin layer 20 is formed on the semiconductor substrate 10. The resin layer 20 is formed so that a part of the semiconductor substrate 10 (part of the passivation film 18, for example) is exposed. The resin layer 20 is an electrical insulating layer. The resin layer 20 does not contain conductive particles. The resin layer 20 may have a stress relief function. The resin layer 20 may be formed of a polyimide resin, silicone-modified polyimide resin, epoxy resin, silicone-modified epoxy resin, benzocyclobutene (BCB), polybenzoxazole (PBO), or the like. The resin layer 20 may be formed of a material having a light shielding property. The resin layer 20 is formed to avoid the top of the electrodes 16. At least a part of the resin layer 20 may be formed on the integrated circuit 12 (or active region).

The semiconductor device includes wiring pattern 22 electrically connected with the electrodes 16. The wiring pattern 22 is formed so that a part of the wiring pattern 22 overlaps the electrode 16. The wiring pattern 22 is formed to extend to the resin layer 20 (upper surface of the resin layer 20, for example). The wiring pattern 22 may pass over the passivation film 18. The wiring pattern 22 may be formed of a three-layer structure consisting of a TiW sputter interconnect layer, a Cu sputter interconnect layer, and a Cu plating interconnect layer, for example.

A plurality of external terminals (solder balls, for example) 24 are formed on the wiring pattern 22. The external terminals 24 may be formed of soft solder or hard solder. As the soft solder, solder containing no lead (hereinafter called lead-free solder) may be used. As the lead-free solder, a tin-silver (Sn-Ag) alloy, tin-bismuth (Sn-Bi) alloy, tin-zinc (Sn-Zn) alloy, or tin-copper (Sn-Cu) alloy may be used. At least one of silver, bismuth, zinc, and copper may be added to these alloys. The external terminal 24 is formed on the resin layer 20 and is supported by the resin layer 20. Therefore, a part of the external force applied to the external terminal 24 is absorbed by the resin layer 20.

The semiconductor device includes a plurality of dummy terminals 26. The dummy terminals 26 are not electrically connected with the electrodes 16. The dummy terminals 26 are not electrically connected with the external terminals 24. The dummy terminals 26 are supported by the resin layer 20. For example, the dummy terminals 26 may be formed on pads 28 formed on the resin layer 20.

Figure 4:
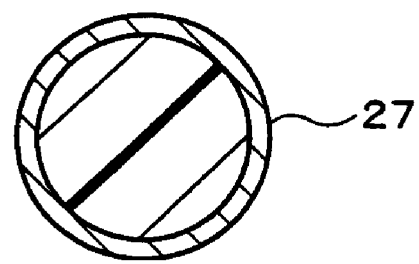
FIG. 4 is illustrative of a modification of a dummy terminal.

The dummy terminal 26 may be formed of the same material as the external terminal 24 (solder, for example). The dummy terminal 26 may be formed of a material different from the material for the external terminal 24 so that the dummy terminal 26 and the external terminal 24 differ in properties (elasticity, adhesion, and the like). If the dummy terminals 26 are formed of an adhesive, the dummy terminals 26 can be caused to adhere to a motherboard while being crushed. This enables the difference in size between the dummy terminals 26 to be absorbed. As a modification, a dummy terminal 27 shown in FIG. 4 includes a center portion formed of a resin and a surface layer formed of solder. This allows the dummy terminals 26 to be easily elastically deformed, whereby the dummy terminals 26 can be prevented from being removed from the interconnect pattern of the motherboard, even if external force is applied. Moreover, the dummy terminals 26 and the external terminals 24 can be connected at the same time by forming the surface layer by using solder.

In the case where the upper surface of the resin layer 20 is in a shape of a rectangle, the dummy terminals 26 may be formed at least at a pair of corners on the diagonal of the rectangle. The upper surface of the resin layer 20 may be divided into a first region which is located on the end and a second region which is closer to the center than the first region. In this case, the dummy terminals 26 may be formed in the first region and the external terminals 24 may be formed in the second region. According to the present embodiment, since bonding strength can be increased by the dummy terminals 26 when bonding the semiconductor device to a motherboard or the like, electrical connection failure of the external terminals 24 can be reduced.

The semiconductor device may include a second resin layer (protective layer such as a solder resist) 30. The second resin layer 30 is formed on the resin layer 20. The second resin layer 30 is formed to cover the wiring pattern 22 so as to avoid an area of the wiring pattern 22 in which the external terminal 24 is formed (land, for example). An opening which exposes the wiring pattern 22 on the resin layer 20 is formed in the second resin layer 30. The external terminal 24 is connected with the wiring pattern 22 through the opening formed in the second resin layer 30. The second resin layer 30 is in contact with at least the base of the external terminals 24. The second resin layer 30 may cover the electrodes 16.

In a method of manufacturing the semiconductor device according to the present embodiment, a semiconductor wafer is used as the semiconductor substrate 10. The resin layer 20 is formed on the semiconductor substrate 10 (on the passivation film 18, for example). The formation process of the resin layer 20 may include applying a resin precursor (thermosetting resin precursor, for example) to the semiconductor substrate 10, or forming a resin precursor layer by spreading a resin precursor on the semiconductor substrate 10 by spin coating. A continuous or integral resin precursor layer may be formed by using a radiation sensitive resin precursor having a property sensitive to radiation (light (ultraviolet light or visible light), X-rays, or electron beams), and the resin precursor layer may be patterned. The resin precursor layer is patterned by applying lithography. The resin layer 20 may be formed by printing (screen printing, for example). The resin layer 20 may be formed of either a plurality of layers or a single layer. The resin layer 20 is formed to avoid the top of the electrodes 16. The resin layer 20 may be formed to avoid a cutting region of the semiconductor substrate 10.

The wiring pattern 22 are formed to be electrically connected with the electrodes 16. The wiring pattern 22 is formed to extend to the resin layer 20. The wiring pattern 22 is formed to pass over the electrode 16. The wiring pattern 22 may pass on the side surface of the resin layer 20. The wiring pattern 22 may be formed to include a land (area wider than the line). The external terminal 24 is formed on the land. The wiring pattern 22 may be formed of either a single layer or a plurality of layers. For example, a TiW sputter film and a Cu sputter film are stacked in that order by sputtering, and a plating resist film is then formed. An opening corresponding to the wiring pattern 22 is formed in the plating resist film by using photolithographic technology, and a Cu plating interconnect layer is formed by copper electroplating through the opening. The plating resist film is then removed and a Cu sputter interconnect layer and a TiW sputter interconnect layer are formed by etching the Cu sputter film and the TiW sputter film by using the Cu plating interconnect layer as a mask to form the wiring pattern 22.

The second resin layer 30 may be formed on the resin layer 20. The description of the resin layer 20 may be applied to the second resin layer 30. The second resin layer 30 may be a solder resist. The second resin layer 30 is formed to cover the wiring pattern 22 excluding a part (center of the land, for example) of the wiring pattern 22. The second resin layer 30 may be formed so that the cutting region of the semiconductor substrate 10 is exposed.

The external terminals 24 are formed on the wiring pattern 22 so as to be supported by the resin layer 20. The external terminals 24 may be formed by applying a conventional method. The dummy terminals 26 are formed so as to be supported by the resin layer 20. The pads 28 may be formed on the resin layer 20, and the dummy terminals 26 may be formed on the pads 28.

A third resin layer (not shown) may be formed on the second resin layer 30, if necessary. The description of the resin layer 20 may be applied to the third resin layer. The third resin layer is formed to cover an area other than the top of the external terminals 24. This enables stress which occurs due to external force applied to the external terminals 24 to be dispersed. This also enables bonding between the external terminals 24 and the wiring pattern 22 to be reinforced. The third resin layer may be formed to cover the entire semiconductor substrate 10 and then patterned. The third resin layer may be formed to cover the external terminals 24 and be removed from the top of the external terminals 24. The third resin layer may be patterned by applying lithography. A part of the third resin layer may be removed by using a laser or ashing.

Figure 5:
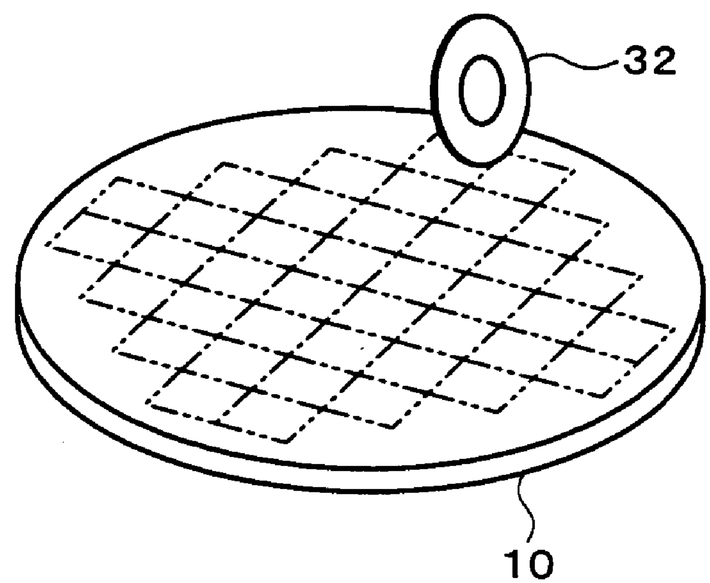
FIG. 5 is illustrative of a method of manufacturing a semiconductor device according to a first embodiment of the present invention.

As shown in FIG. 5, the semiconductor substrate 10 may be cut (diced or scribed). If the resin layer 20 and the second resin layer 30 are not formed in the cutting region of the semiconductor substrate 10, clogging of a cutter (or blade) 32 can be prevented since the resin is not cut. The semiconductor device is thus obtained.

Second Embodiment

Figure 6:
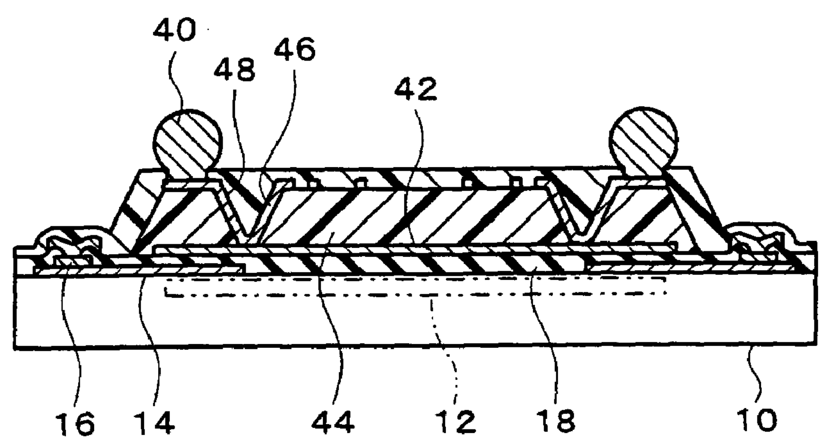
FIG. 6 is illustrative of a semiconductor device according to a second embodiment of the present invention.

FIG. 6 is illustrative of a semiconductor device according to a second embodiment of the present invention. In the present embodiment, a conductive film 42 is formed below the external terminals (not shown) and dummy terminals 40. The conductive film 42 shown in FIG. 6 is formed on the semiconductor substrate 10 (on the passivation film 18, for example) under a resin layer 44. However, the conductive film 42 may be formed inside the resin layer 44. The conductive film 42 may be formed to cover the integrated circuit 12 (region in which the active element is formed, for example). This enables an electromagnetic wave shielding effect for the integrated circuit 12 to be obtained.

Figure 7:
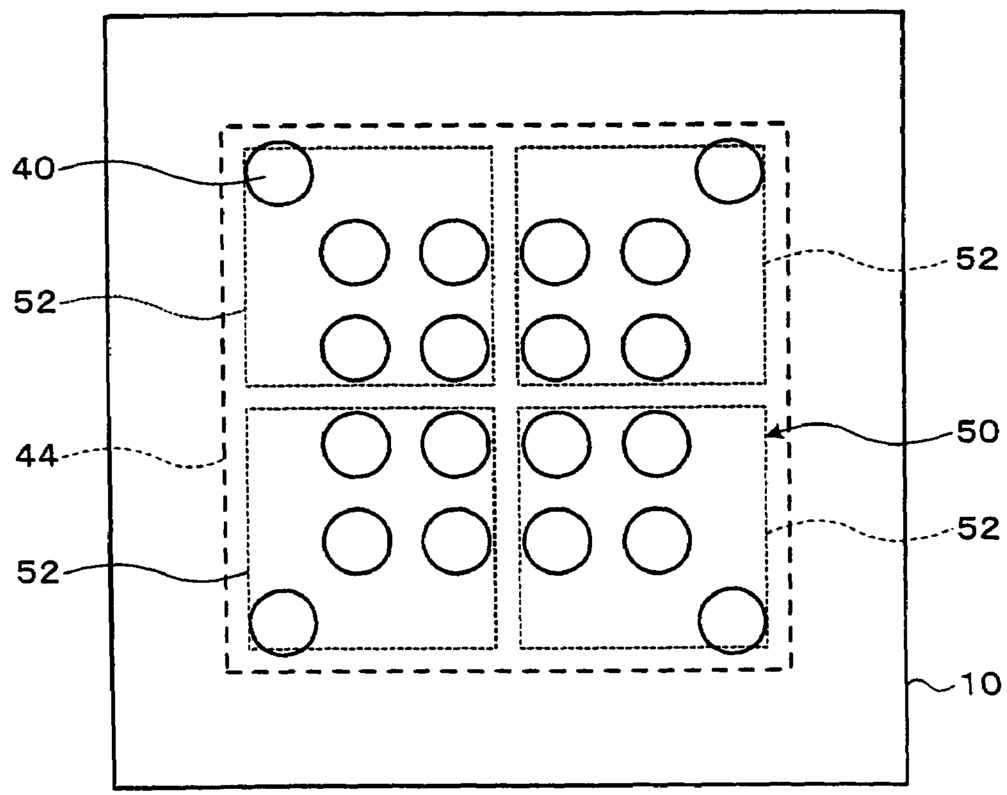
FIG. 7 is illustrative of a modification of a semiconductor device according to the second embodiment of the present invention.

As a modification, a conductive film 50 may be divided into a plurality of sections 52 provided at an interval from each other, as shown in FIG. 7. The influence of internal stress of the conductive film 50 on the semiconductor substrate 10 can be reduced by dividing the conductive film 50. The conductive film 50 is formed so that the integrated circuit 12 (region in which the active element is formed, for example) is located in the region in which the sections 52 are formed (region including the sections 52 and the space between the sections 52). This enables the electromagnetic wave shielding effect for the integrated circuit 12 to be obtained.

In the examples shown in FIGS. 6 and 7, the conductive film 42 (or 50) is electrically connected with the dummy terminals 40 without being electrically connected with the electrodes 16. In more detail, through-holes 46 are formed in the resin layer 44 so as to overlap a part of the conductive film 42 (or 50). A wiring pattern 48 is formed from the conductive film 42 (or 50) so as to pass on the inner surface of the through-hole 46 and extend to the upper surface of the resin layer 44. The dummy terminals 40 are formed on the wiring pattern 48 so as to be supported by the resin layer 44. The material for the dummy terminal 40 may be selected from the materials used for the external terminal 24 (see FIG. 2). The electromagnetic wave shielding effect can be increased by electrically connecting the conductive film 42 (or 50) with GND through the dummy terminals 40.

The description in the first embodiment is applied to other configurations and the manufacturing method. In the present embodiment, the effects described in the first embodiment can also be achieved.

Figure 8:
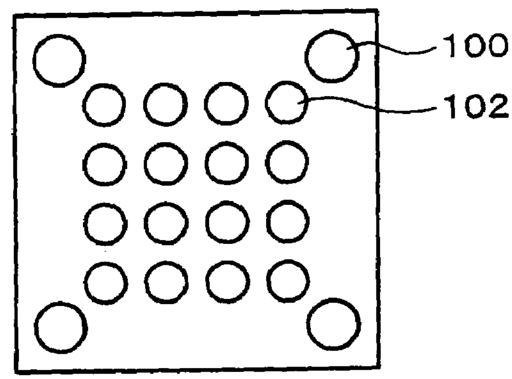
FIG. 8 is illustrative of a modification of a dummy terminal.
Figure 9:
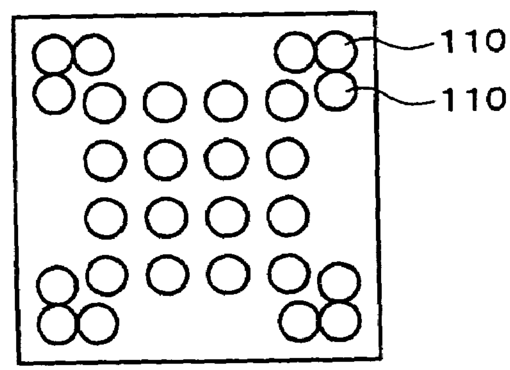
FIG. 9 is illustrative of another modification of a dummy terminal.
Figure 10:
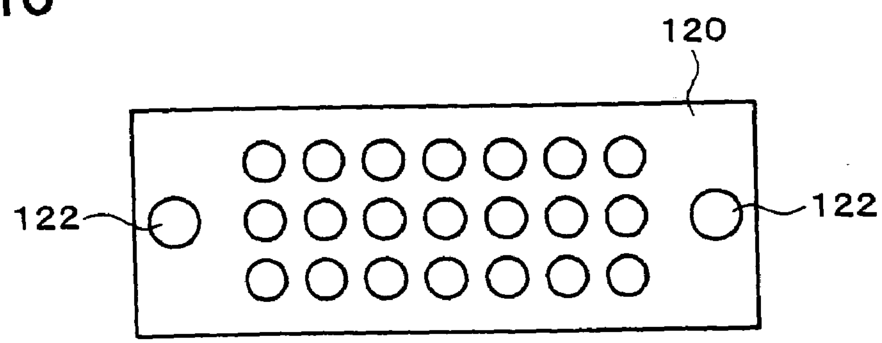
FIG. 10 is illustrative of another modification of a dummy terminal.

FIGS. 8 to 10 are illustrative of modifications of the dummy terminals. These modifications may be applied to the first and second embodiments. As shown in FIG. 8, dummy terminals 100 may be formed to be larger than all the external terminals 22. This enables adhesion of the dummy terminals 100 to be increased. As shown in FIG. 9, at least two dummy terminals 110 may be disposed to be adjacent to each other. At least two dummy terminals 110 may be unified by melting the dummy terminals 110. This enables adhesion of the dummy terminals 110 to be increased without changing the size of the dummy terminals 110. In the case where a resin layer 120 has an oblong shape (rectangle or oval, for example) as shown in FIG. 10, dummy terminals 122 may be formed on both ends of the oblong shape in the longitudinal direction.

Third Embodiment

Figure 11:
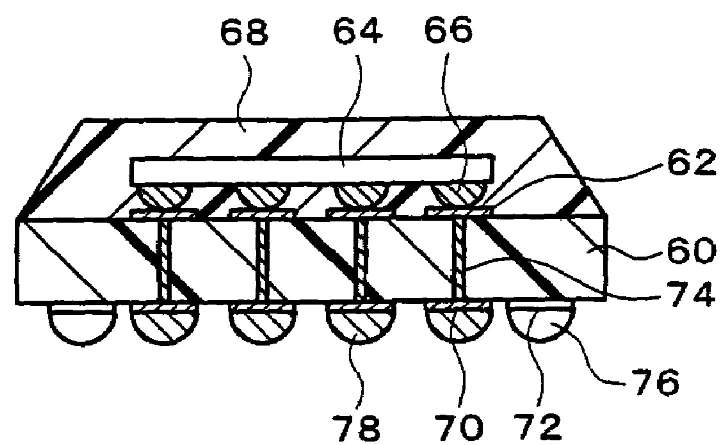
FIG. 11 is a cross-sectional view showing a semiconductor device according to a third embodiment of the present invention.
Figure 12:
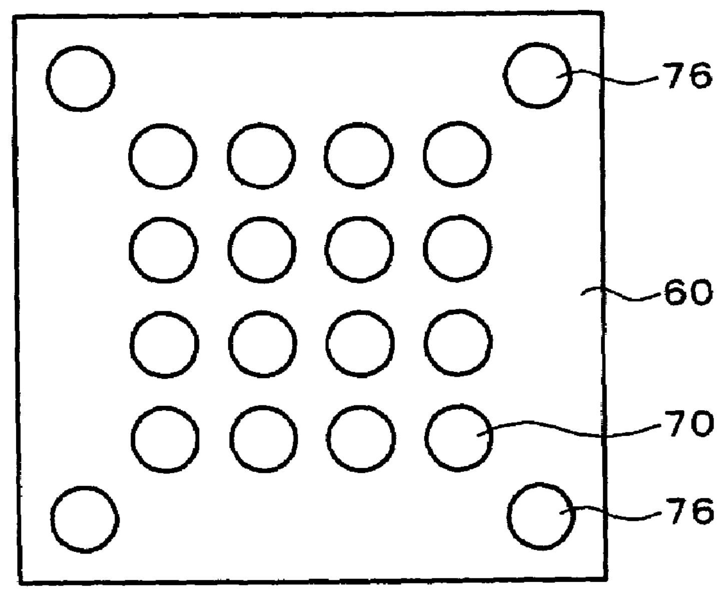
FIG. 12 is a cross-sectional view showing a semiconductor device according to the third embodiment of the present invention.

FIG. 11 is a cross-sectional view illustrating a semiconductor device according to a third embodiment of the present invention. FIG. 12 is a bottom view of the semiconductor device. An interconnect layer 62 is formed on the surface of an interposer substrate 60. A semiconductor chip (IC chip, for example) 64 is mounted (surface-mounted, for example) on the surface of the interposer substrate 60. The semiconductor chip 64 is connected with the interconnect layer 62 through bumps 66 and is sealed with a mold resin 68.

An interconnect layer 70 and lands 72 are formed on the back surface of the interposer substrate 60. The interconnect layers 62 and 70 are connected through through-holes 74 formed in the interposer substrate 60. The lands 72 are disposed on the outermost periphery of the interposer substrate 60. Dummy bumps (or dummy balls) 76 are formed on the lands 72. The dummy bumps 76 are disposed on the outermost periphery of the interposer substrate 60. External terminals (solder balls, for example) 78 are disposed more inwardly on the interposer substrate 60 than the dummy bumps 76. The external terminals 78 are connected with the interconnect layer 70.

According to the present embodiment, the external terminals 78 can be prevented from being disposed on the outermost periphery (region in which frequency of connection failure is high) of the interposer substrate 60. Moreover, the connection state of the external terminals 78 can be reinforced by the dummy bumps 76 after mounting the interposer substrate 60 on the motherboard. Therefore, connection failure of the external terminals 78 can be reduced during surface mounting without increasing the number of mounting steps even if the size of the semiconductor device is increased, whereby reliability during secondary mounting of the semiconductor device to which the ball grid array is applied can be improved while preventing a decrease in throughput.

Figure 13:
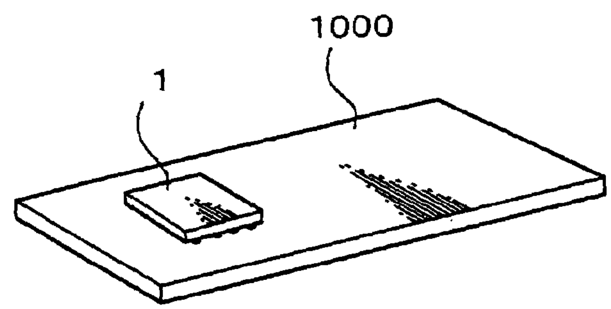
FIG. 13 shows a circuit board on which a semiconductor device according to an embodiment of the present invention is mounted.
Figure 14:
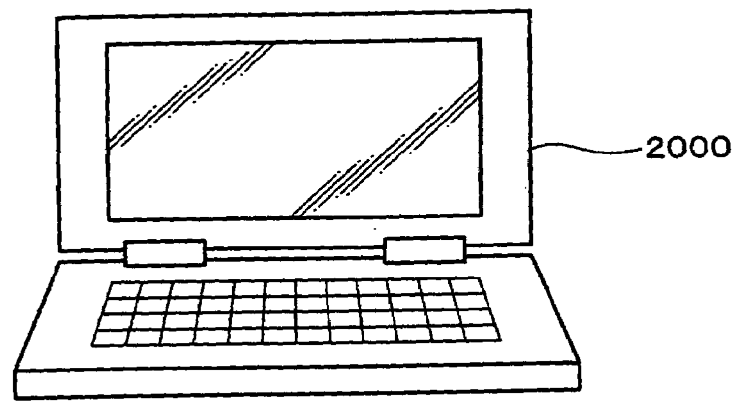
FIG. 14 shows an electronic instrument including a semiconductor device according to an embodiment of the present invention.
Figure 15:
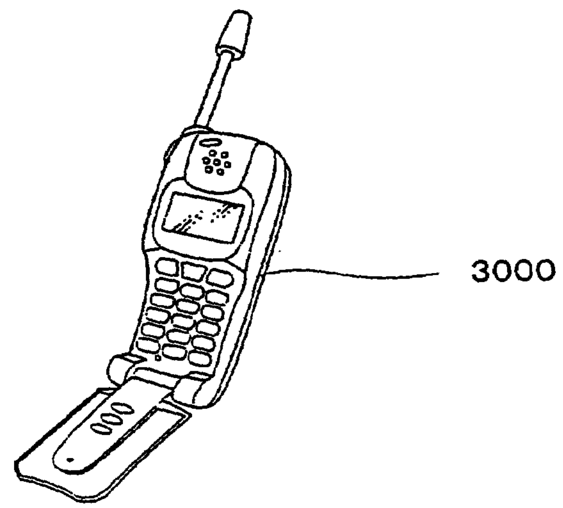
FIG. 15 shows another electronic instrument including a semiconductor device according to an embodiment of the present invention.
Figure 16:
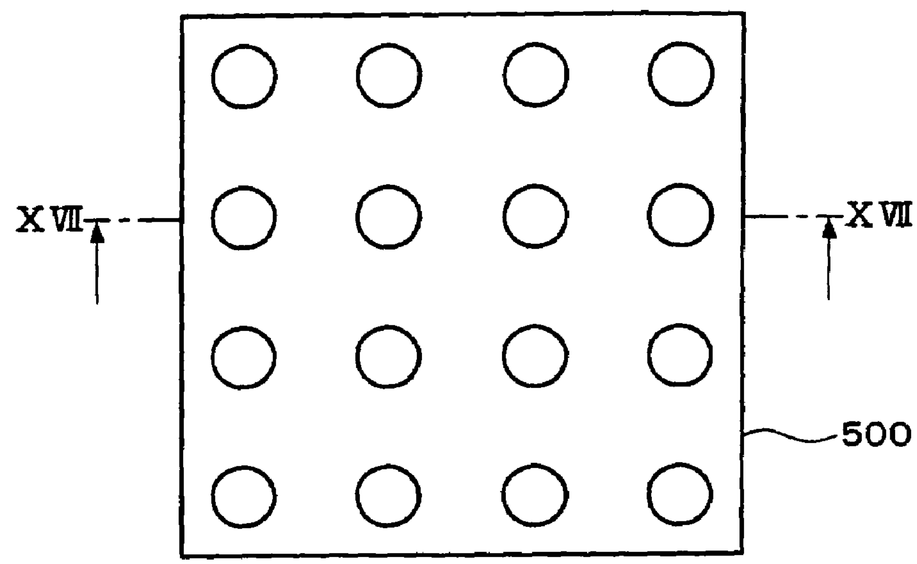
FIG. 16 is a plan view showing a schematic configuration of a conventional ball grid array package.
Figure 17:
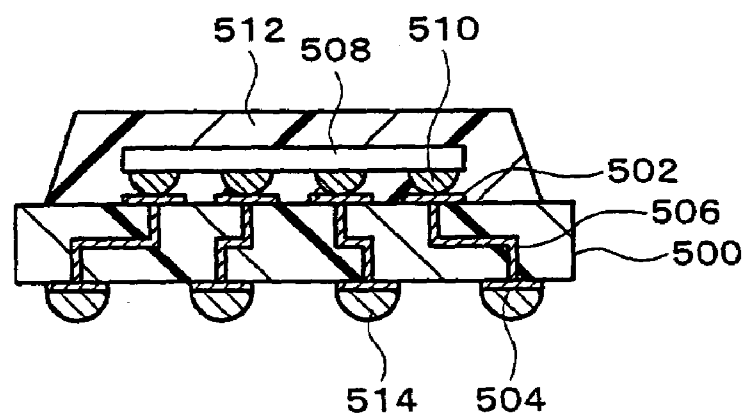
FIG. 17 is a cross-sectional view of the ball grid array package shown in FIG. 16 along the line XVII—XVII.

FIG. 13 shows a circuit board 1000 on which a semiconductor device 1 described in the above embodiment is mounted. FIGS. 14 and 15 respectively show a notebook-type personal computer 2000 and a portable telephone 3000 as examples of electronic instruments including the semiconductor device.

The present invention is not limited to the above-described embodiments. Various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. A semiconductor device comprising:

a semiconductor substrate in which an integrated circuit is formed and which includes interconnects and electrodes, the interconnects electrically connected with the semiconductor substrate, and the electrodes being formed on the interconnects;

a resin layer formed on the semiconductor substrate;

a wiring pattern electrically connected with the electrodes;

a plurality of external terminals which are formed on the wiring pattern and supported by the resin layer; and a plurality of dummy terminals formed above the resin layer so that each of the plurality of dummy terminals overlaps the resin layer without being electrically connected with the electrodes, the entire dummy terminal overlapping the resin layer.

2. The semiconductor device as defined in claim 1, wherein an upper surface of the resin layer includes a first region which is located in an end portion of the resin layer and a second region which is closer to a center of the resin layer than the first region, wherein the dummy terminals are formed in the first region, and wherein the external terminals are formed in the second region.

3. The semiconductor device as defined in claim 2, wherein the upper surface of the resin layer is in a shape of a rectangle, and wherein the dummy terminals are formed at least at a pair of corners of the rectangle on a diagonal.

4. The semiconductor device as defined in claim 2, wherein the upper surface of the resin layer has an oblong shape, and wherein the dummy terminals are formed on both ends of the oblong shape in a longitudinal direction.

5. The semiconductor device as defined in claim 1, wherein at least two of the dummy terminals are disposed adjacent to each other.

6. The semiconductor device as defined in claim 1, wherein each of the dummy terminals is formed of a material different from a material for each of the external terminals.

7. The semiconductor device as defined in claim 1, wherein each of the dummy terminals is formed to include a center portion formed of a resin and a surface layer formed of solder.

8. The semiconductor device as defined in claim 1, wherein each of the dummy terminals is larger than each of the external terminals.

9. The semiconductor device as defined in claim 1, further comprising:

a conductive film which is formed below the external terminals and the dummy terminals.

10. The semiconductor device as defined in claim 9, wherein the conductive film is formed over the semiconductor substrate and under the resin layer.

11. The semiconductor device as defined in claim 9, wherein the conductive film is formed to cover a region in which the integrated circuit is formed.

12. The semiconductor device as defined in claim 9, wherein the conductive film is divided into a plurality of sections provided at an interval from each other.

13. The semiconductor device as defined in claim 12, wherein the integrated circuit is formed in a region in which the plurality of sections forming the conductive film are formed.

14. The semiconductor device as defined in claim 9, wherein the conductive film is electrically connected with the dummy terminals without being electrically connected with the electrodes.

15. A circuit board on which the semiconductor device as defined in claim 1 is mounted.

16. An electronic instrument having the semiconductor device as defined in claim 1.

17. A method of manufacturing a semiconductor device comprising:

forming a resin layer on a semiconductor substrate in which an integrated circuit is formed and which includes interconnects and electrodes, the interconnects electrically connected with the semiconductor substrate, and the electrodes being formed on the interconnects;

forming a wiring pattern so as to be electrically connected with the electrodes;

forming a plurality of external terminals on the wiring pattern so as to be supported by the resin layer; and forming a plurality of dummy terminals above the resin layer so that each of the plurality of dummy terminals overlaps the resin layer without being electrically connected with the electrodes, the entire dummy terminal overlapping the resin layer.

* * * * *